United States Patent [19]

Ogata et al.

[11] Patent Number: 5,053,981

[45] Date of Patent: Oct. 1, 1991

[54] METHOD OF MEASURING ELECTRICAL CHARACTERISTICS OF ELECTRONIC CIRCUIT

[75] Inventors: Teruaki Ogata; Yuko Sudou, both of Itami, Japan

[73] Assignee: Mitsubishi Denki Kabushiki Kaisha, Japan

[21] Appl. No.: 428,586

[22] Filed: Oct. 30, 1989

[30] Foreign Application Priority Data

Jul. 28, 1989 [JP] Japan .................................. 1-194009

[51] Int. Cl.$^5$ ............................................. G01R 31/28
[52] U.S. Cl. .................... 364/580; 364/481; 371/27
[58] Field of Search ............... 324/73.1; 364/152, 480, 364/481, 580; 371/27

[56] References Cited

U.S. PATENT DOCUMENTS

| | | | |
|---|---|---|---|
| 3,931,506 | 1/1976 | Borrelli et al. | 324/73.1 X |
| 4,550,406 | 10/1985 | Neal | 324/73.1 X |
| 4,862,399 | 8/1989 | Freeman | 364/580 |
| 4,977,531 | 12/1990 | Ogata et al. | 364/580 |

Primary Examiner—Parshotam S. Lall
Assistant Examiner—Edward R. Cosimano

Attorney, Agent, or Firm—Leydig, Voit & Mayer

[57] ABSTRACT

In a method of measuring characteristics of an electronic circuit on a plurality of measurement items by means of a measuring apparatus which operates in accordance with a measurement execution program, a plurality of measurement specifications the measurement items are expressed in the form of a measurement specification description table of a fixed-word-length type. A measurement specification description program is formed in which the measurement specification description table is directly reflected. A measurement execution program is formed by appointing a measuring sequence in the measurement specification description program and by removing redundancy and combining programs of a plurality of measuring items which can be measured in parallel. The measurement execution program is subjected to a debugging conducted by operating the measuring apparatus in accordance with the measurement execution program. The measurement specification description program is amended in accordance with the modification of the measurement execution program effected through the debugging. The characteristics of the electronic circuit are measured by the measuring apparatus in accordance with the measurment execution program after the debugging.

4 Claims, 2 Drawing Sheets

METHOD OF MEASURING ELECTRICAL CHARACTERISTICS OF ELECTRONIC CIRCUIT

BACKGROUND OF THE INVENTION

1. Field of the Invention

The present invention relates to a method of measuring electrical characteristics of an electronic circuit such as an IC in accordance with a predetermined measuring program.

2. Description of the Related Art

In general, an electronic circuit after design and construction is subjected to measurement of electrical characteristics conducted by a measuring apparatus. Usually, the measuring apparatus has a plurality of signal generating means and measuring means which are operated in accordance with a predetermined measuring program so as to perform measurement and test of various items.

FIG. 2 is a block diagram of a system for measuring electrical characteristics of an electronic circuit by means of such a measuring apparatus. Referring to this Figure, a measuring jig 3 is connected through a cable 2 to the measuring apparatus which is denoted by 1. The measuring jig 3 has an interface circuit 4 for connection to the cable 2, a peripheral circuit 5 and a socket jig 6. An IC as the electronic circuit to be measured is connected to the socket jig 6. The peripheral circuit 5 has a multiplicity of change-over switches (relays) so as to be able to simulate environmental conditions under which the IC 7 is to be used actually and to enable the IC 7 to be tested.

The measuring apparatus 1 operates in accordance with a measuring program, so that electrical signals are supplied to the IC 7 through the interface circuit 4 and the peripheral circuit 5. Outputs from the IC 7 are transmitted to the measuring apparatus 1 through the peripheral circuit 5 and the interface circuit 4 so as to be measured by the measuring apparatus 1. Thus, various tests are executed on the IC 7 in accordance with the measuring program.

The measuring program for operating the measuring apparatus 1 is formulated by a program language peculiar to the measuring apparatus 1. Hitherto, a process having the following steps has been used for forming the measuring program.

Step 1

Items of electrical characteristics to be measured on the IC 7 are selected and a measurement specification is worked out on the basis of these items, and a measuring jig 3 for enabling measurement of all these items is designed and fabricated.

Step 2

The measuring program is formed in accordance with the measurement specification using a programming language peculiar to the measuring apparatus 1.

Step 3

The measuring jig 3 is connected through the cable 2 to the measuring apparatus 1 and the IC 7 is mounted in the socket jig 6 of the measuring jig 3. The measuring apparatus is operated in accordance with the measuring program to enable a check as to whether desired data are obtainable. When the desired data are failed, the causes of the failure are investigated and the measuring program is modified to eliminate such causes. This operation is repeated until data of all the required items are safely obtained.

Measuring program free of error is thus obtained. The measuring program is then improved through the following Steps 4 to 6.

Step 4

Any duplication or unnecessary program statement is eliminated.

Step 5

The program is modified to enable parallel or simultaneous measurement of a plurality of measurement items which are measurable under independent measuring conditions and data of which can be handled and processed concurrently or at such high speeds as can be regarded as being materially concurrent.

Step 6

Measuring sequence are modified and optimized to enable analysis of rejection and to attain improvement in the yield and reduction in the measuring time.

Efficiency of the measurement is appreciably improved through Steps 4 to 6. Each of Steps 4 to 6, however, requires that debugging be conducted in the same manner as that in Step 3 described before.

The above-described process for forming a measuring program essentially requires high degree of knowledge both in the hardware and the software of the measuring apparatus 1, which in turn necessitates a skilled engineer having a good command of the programming language peculiar to the measuring apparatus 1. In addition, formation and modification of the measuring program are quite time-consuming and require much time and labor.

In particular, the operation for changing the measuring sequence conducted in Step 6 is quite complicated and difficult, since this work has to be done taking into account the measuring conditions deleted or rewritten in Steps 4 and 5.

SUMMARY OF THE INVENTION

Accordingly, an object of the present invention is to provide a method of measuring electrical characteristics of an electronic circuit which enables an easy formation of a measuring program having excellent measuring efficiency, thereby overcoming the above-described problems of the prior art.

To this end, according to the present invention, there is provided a method of measuring characteristics of an electronic circuit by means of a measuring apparatus which operates in accordance with a measurement execution program, the method comprising: expressing a plurality of measurement specifications corresponding to a plurality of measurement items in the form of a measurement specification description table of a fixed-word-length type; forming a measurement specification description program in which the measurement specification description table is directly reflected; forming a measurement execution program by appointing a measuring sequence in the measurement specification description program and by removing redundancy and combining programs of a plurality of measuring items which can be measured in parallel; debugging the measurement execution program by operating the measuring apparatus in accordance with the measurement execution program; amending the measurement specification description program in accordance with the modification of the measurement execution program affected through the debugging; and measuring the characteristics of the electronic circuit by the measuring apparatus in accordance with the measurement execution program after the debugging.

DESCRIPTION OF THE PREFERRED EMBODIMENTS

An embodiment of the present invention will be described hereinafter with reference to the accompanying drawings.

Figure 1:
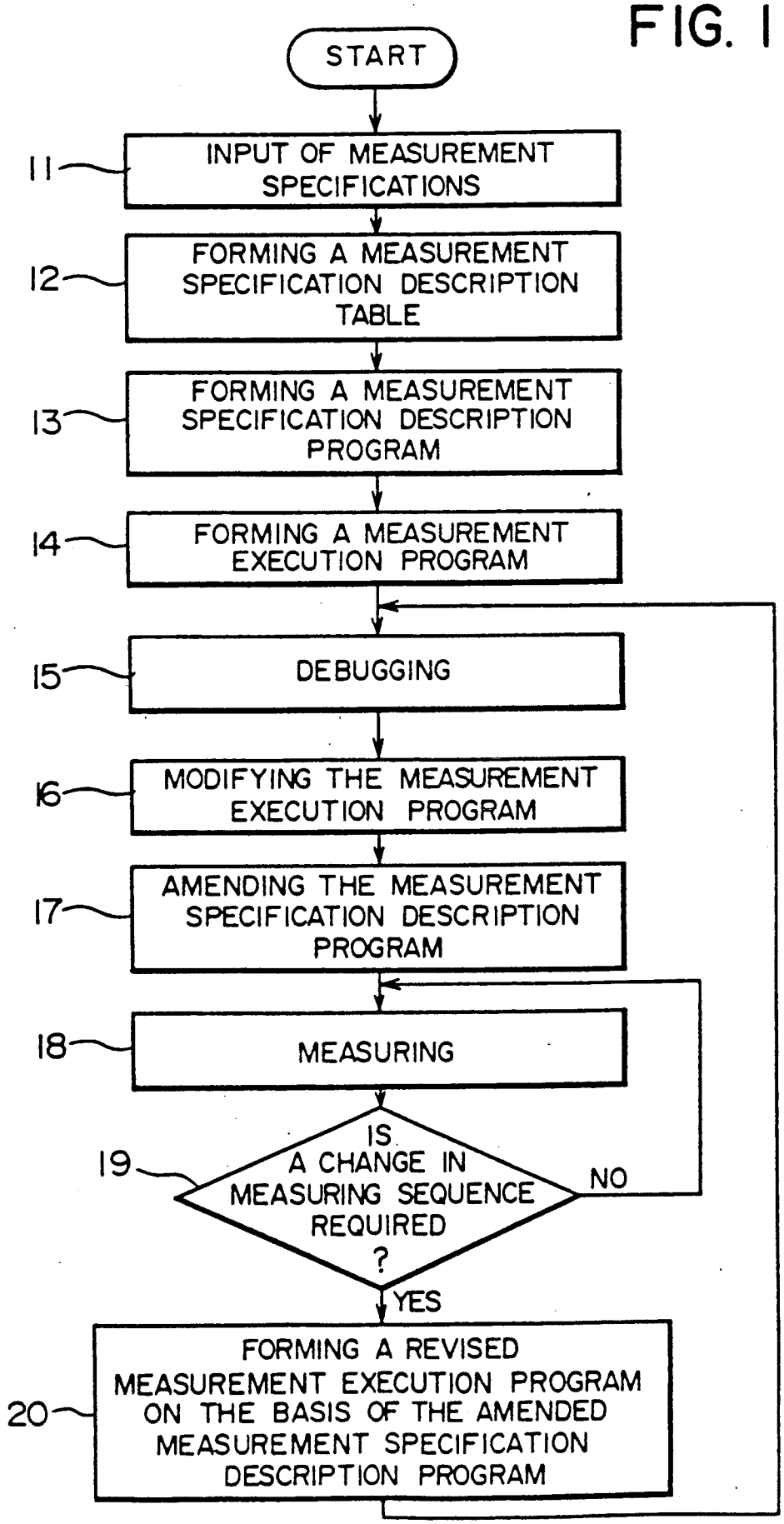
FIG. 1 is a flow chart illustrating an embodiment of the method of the invention for measuring characteristics of an electronic circuit.
Figure 2:
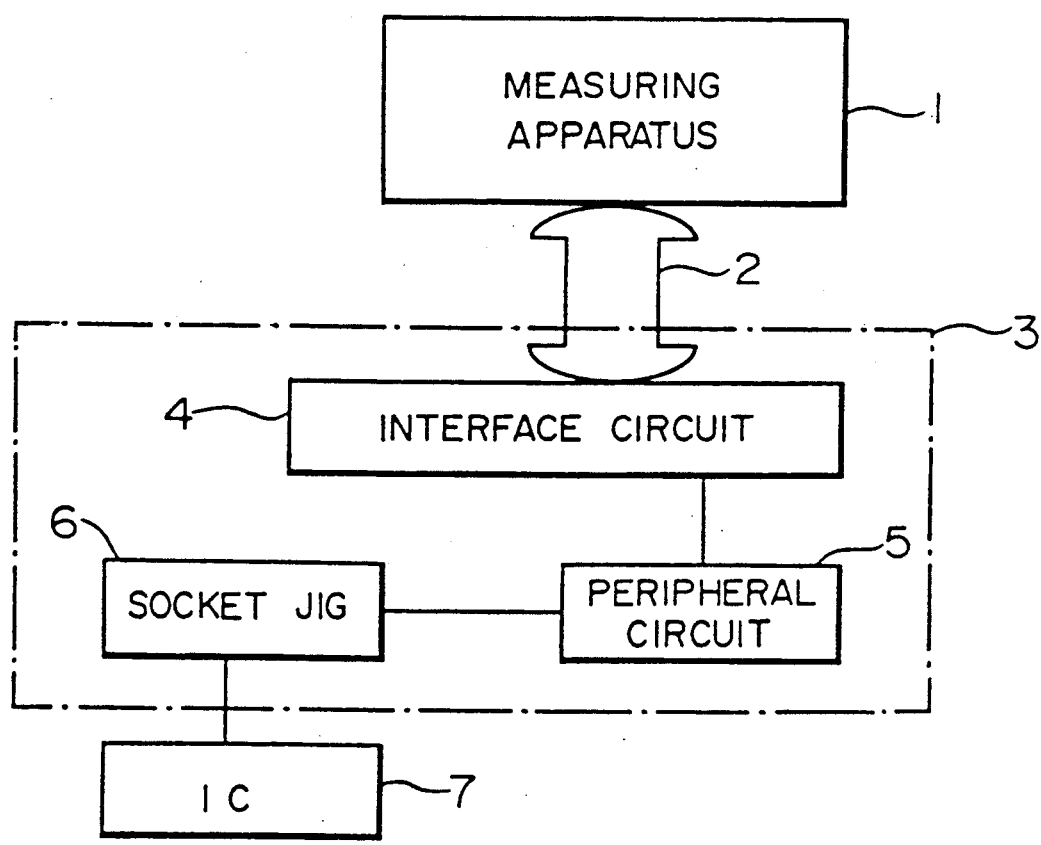
FIG. 2 is a block diagram of a conventional apparatus for measuring electrical characteristics of an electronic circuit.

Referring to FIG. 1, a measurement specification of an electronic circuit as the measuring object is written by an operator in the form of natural language for each of measurement items in Step 11. In Step 12, the measurement specifications are arranged in the form of Tables of fixed-word-length type, whereby a measurement specification description table is formed. In this Step, the data in the measurement specifications input in Step 11 are allocated in accordance with the contents and sequence suitable for the programming.

In Step 13, the measurement specification description table is converted into a measurement specification description program which contains all the control data of the measuring apparatus (not shown) described in the measurement specification description table and, hence, the content of the measurement specification description table is directly reflected in this measurement specification description program. That is, the contents of measurement of the respective measurement items are described in independent and completive forms. Therefore, execution of measurement with this program is possible even when the program of an arbitrary one of the items is taken out or even when the sequence of the measurement items is altered.

Step 14 forms a measurement execution program. To this end, the sequence of the measuring items in the measurement specification description program formed in Step 13 is changed in accordance with an externally given sequence changing instruction. In addition, the measurement specification description program with the changed measuring sequence is further processed to eliminate any redundancy such as duplicate of program description or unnecessary program description. At the same time, combination of programs is conducted to enable a parallel or simultaneous processing of a plurality of measurement items which can be processed concurrently or at speeds high enough to be regarded as being processable concurrently. A measurement execution program is formed through these operations.

Debugging of the measurement execution program is conducted in Step 15. Namely, the measuring apparatus is actually operated in accordance with the measurement execution program formed in Step 14 to enable check of operation of the measuring apparatus for each of the measurement items. If the desired data cannot be obtained, the measurement execution program is suitably modified in Step 16. This operation is repeated until desired data are obtained for all the measurement items.

A measurement execution program for actual use is thus prepared. However, when the measurement execution program formed in Step 15 is modified in Step 16, Step 17 is further executed to amend the measurement specification description program formed in Step 13, in accordance with the content of the modification affected in Step 16.

Measurement of characteristics of the electronic circuit is then conducted in Step 18.

In Step 19, a question is posed as to whether a change in the measuring sequence is necessary for the purpose of analysis of causes of rejection, improvement in the yield, shortening of measuring time or other requirement. If the answer is YES, the process proceeds to Step 20 in which a process is conducted again for forming a revised measurement execution program. In this process, a revised measurement execution program is formed on the basis of the above-mentioned measurement specification description program amended in accordance with the result of the debugging in Step 15. Any change in the sequence of the measurement items can be conducted very easily because the programs of measurements of the respective measurement items are written in independent and completive form in the measurement specification description program. Thereafter, elimination of duplicate or unnecessary program description and combination of the measuring items which can be measured simultaneously are conducted so that the revised measurement execution program is obtained. The process then returns to Step 15 to enable debugging of the revised measurement execution program. Subsequently, Steps 16 and 17 are executed for amendment of the measurement execution program and amendment of the measurement specification description program, followed by execution of Step 18 in which the measurement is conducted.

A practical example of measurement of characteristics of an electronic circuit will be described. It is assumed here that measurement is conducted on six measurement items shown in Tables 1 to 6 on an IC.

TABLE 1

| Test item: | Terminal voltage 1 V1 | |
|---|---|---|
| Peripheral circuit switch conditions: | SW ON 1 3 18 38 | |
| Measuring conditions: | Terminal 1 Voltage measured | |
| 2 | 12 V | 200 mA |
| 3 | 4 V | 20 mA |
| 4 | GND | |
| Criterion value: | [12 V (source voltage)]-[terminal 1 voltage] | |
| | 5.35 V at minimum | |
| | 6.55 V at maximum | |

TABLE 2

| Test item: | Terminal voltage 5 V5 | |
|---|---|---|
| Peripheral circuit switch conditions: | SW ON 18 38 | |
| Measuring conditions: | Terminal 5 Voltage measured | |
| 2 | 12 V | 200 mA |
| 3 | 4 V | 20 mA |
| 4 | GND | |
| Criterion value: | 2.00 V at minimum 3.00 V at maximum | |

TABLE 3

| Test item | Voltage gain 1 GV1 |
|---|---|
| Peripheral circuit switch conditions: | SW ON 2 4 6 18 38 |
| Measuring conditions: | Terminal A 1 KHz SIN wave volt measured |

TABLE 3-continued

| | | |
|---|---|---|
| 2 | 12 V | 200 mA |
| 3 | 4 V | 20 mA |
| 4 | GND | |
| Criterion value: | 37 dB at minimum 43 dB at maximum | |
| Criterion computing formula: | 20* log (terminal A output/input voltage) | |

TABLE 4

| | | |
|---|---|---|
| Test item: | Voltage gain 2 GV2 | |
| Peripheral circuit switch conditions: | SW ON 2 4 6 18 38 | |
| Measuring conditions: | Terminal A 1 KHz SIN wave volt | |
| 2 | 10 V | 200 mA |
| 3 | 4 V | 20 mA |
| 4 | GND | |
| B Input 1 KHz 2 mVrms | | |
| Criterion value: | 37 dB at minimum 43 dB at maximum | |
| Criterion computing formula: | 20* log (terminal A output voltage/input voltage) | |

TABLE 5

| | | |
|---|---|---|
| Test item: | Oscillation frequency 1 FREQ1 | |
| Peripheral circuit switch conditions: | SW ON 2 4 18 38 50 61 | |
| Measuring conditions: | Terminal C 2 $V_{p-p}$ frequency measured | |
| 2 | 12 V | 200 mA |
| 3 | 4 V | 20 mA |
| 4 | GND | |
| B Input 10 KHz 10 mVrms | | |
| Criterion value: | 9.10 KHz at minimum 10.9 KHz at maximum | |

TABLE 6

| | | |
|---|---|---|
| Test item: | Oscillation frequency 2 FREQ2 | |
| Peripheral circuit switch conditions: | SW ON 2 4 38 50 61 | |
| Measuring conditions: | Terminal C 1 $V_{p-p}$ frequency measured | |
| 2 | 9 V | 200 mA |
| 3 | 4 V | 20 mA |
| 4 | GND | |
| B Input 1 KHz 10 mVrms | | |
| Criterion value: | 9.10 KHz at minimum 10.9 KHz at maximum | |

Thus, the measurement specification for each measurement item includes the following elements or data which are described in Table of fixed-word length type.

1. Item name,
2. Peripheral circuit,
3. Hardware setting,
4. Source,
5. Source supply to electrical circuit,
6. Measured data format,
7. Setting of evaluation criterion,
8. Setting of computation,
9. Sorting/display of measure result,
10. Dismissal of measuring conditions Then, a measurement specification description table as shown in Table 7 is formed with the tables of fixed-word-length type.

TABLE 7

| ITEMS<br>ITEM NAME<br>ITEM NO. & SYMBOL | TERMINAL<br>VOLTAGE 1<br>1, V1 | TERMINAL<br>VOLTAGE 5<br>2, V5 | VOLTAGE<br>GAIN 1<br>3, GV1 |
|---|---|---|---|
| PERIPHERAL CIRCUIT | | | |
| SWITCH GROUP 1 | 1, 3 | | 2, 4, 6 |
| SWITCH GROUP 2 | 18 | 18 | 18 |
| SWITCH GROUP 3 | 38 | 38 | 38 |
| SWITCH GROUP 4 | | | |
| HARDWARE SETTING | | | |
| SINGLE MODE MEASUREMENT | VM | VM | AVM, A |
| PIN CONNECTION | PRV13 = 4 V, 20 mA | PRV13 = 4 V, 20 mA | PRV13 = 4 V, 20 mA |
| | P1 = VM | P5 = VM | |
| | P2 = S1 | P2 = S1 | P2 = S1 |
| | P3 = PRV13 | P3 = PRV13 | P3 = PRV13 |
| | P4 = GND | P4 = GND | P4 = GND |
| | S1 = 12 V, 200 mA | S1 = 12 V, 200 mA | S1 = 12 V, 200 mA |
| SETTING OF VOLT MEASURING DEVICE | DC20 V | | |
| SETTING OF TIME MEASURING DEVICE | | | |
| SETTING OF AUDIO SIGNAL GENERATOR | | | 1 kHz<br>10 mVrms |
| SETTING OF AUDIO SIGNAL MEASURING DEVICE | | | RMS 2 V AC<br>100 mS × 1 |
| SOURCE | ON WAIT = 10 mS | ON WAIT = 10 mS | ON WAIT = 3 mS |
| SOURCE SUPPLY TO ELECTRONIC CIRCUIT | ON WAIT = 100 mS | ON WAIT = 100 mS | ON WAIT = 100 mS |
| MEASURED DATA FORMAT | X.XX V | X.XX V | X.XX dB |
| SETTING OF EVALUATION CRITERION | 5.35 6.35 | 2.00 3.00 | 37 43 |
| SETTING OF COMPUTATION | 12-MEAS | | 20 logVM/10 |
| SORTING/DISPLAY OF MEASURE RESULT | FBIN = 5 | FBIN = 6 | FBIN = 7 |
| DISMISSAL OF MEASURING CONDITIONS | ALL CLEAR | ALL CLEAR | ALL CLEAR |
| ITEMS<br>ITEM NAME<br>ITEM NO. & SYMBOL | VOLTAGE<br>GAIN 2<br>4, GV2 | OSCILLATION<br>FREQUENCY 1<br>5, FREQ1 | OSCILLATION<br>FREQUENCY 2<br>6, FREQ2 |
| PERIPHERAL CIRCUIT | | | |
| SWITCH GROUP 1 | 2, 4, 6 | 2, 4, 6 | 2, 4 |
| SWITCH GROUP 2 | 18 | 18 | |
| SWITCH GROUP 3 | 38 | 38 | 38 |
| SWITCH GROUP 4 | | 50, 61 | 50, 61 |
| HARDWARE SETTING | | | |
| SINGLE MODE MEASUREMENT | AVM, A | TIME, C | TIME, C |
| PIN CONNECTION | PRV13 = 4 V, 20 mA | PRV13 = 4 V, 20 mA | PRV11 = 4 V, 20 mA |

TABLE 7-continued

|  | | | |
|---|---|---|---|
|  | P2 = S1 | P2 = S1 | P2 = S1 |
|  | P3 = PRV13 | P3 = PRV13 | P3 = PRV13 |
|  | P4 = GND | P4 = GND | P4 = GND |
|  | S1 = 10 V, 200 mA | S1 = 12 V, 200 mA | S1 = 9 V, 200 mA |
| SETTING OF VOLT MEASURING DEVICE |  |  |  |
| SETTING OF TIME MEASURING DEVICE |  |  |  |
|  |  | FREQ A | FREQ A |
|  |  | 1 V, +SL100 kHz | 0 V, +SL10 kHz |
| SETTING OF AUDIO SIGNAL GENERATOR | 1 kHz | 10 kHz | 1 kHz |
|  | 2 mVrms | 10 mVrms | 10 mVrms |
| SETTING OF AUDIO SIGNAL MEASURING DEVICE | RMS 2 V AC | | |
|  | 100 mS × 1 | | |
| SOURCE | ON WAIT = 3 mS | ON WAIT = 3 mS | ON WAIT = 3 mS |
| SOURCE SUPPLY TO ELECTRONIC CIRCUIT | ON WAIT = 100 mS | ON WAIT = 100 mS | ON WAIT = 100 mS |
| MEASURED DATA FORMAT | X.XX dB | X.XX kH | X.XX kH |
| SETTING OF EVALUATION CRITERION | 37 43 | 9.10 10.90 | 9.10 10.90 |
| SETTING OF COMPUTATION | 20 logVM/2 | | |
| SORTING/DISPLAY OF MEASURE RESULT | FBIN = 8 | FBIN = 9 | FBIN = 10 |
| DISMISSAL OF MEASURING CONDITIONS | ALL CLEAR | ALL CLEAR | ALL CLEAR |

The measurement specification description program is formed by directly converting the measurement specification description table into programming language. The measurement specification description program thus formed, when executed in accordance with the sequence described in the measurement specification description table, is still redundant due to presence of duplication or useless program description. Such redundant portion is therefore removed from the measurement specification description program, whereby a measurement execution program is formed. Table 8 shows the thus formed measurement execution program in the same style as the measurement specification description table shown in Table 7. From a comparison between Tables 7 and 8, it will be seen that the measurement execution program is much simplified as compared with the measurement specification description table in terms of the programming language.

TABLE 8

| ITEMS | TERMINAL | TERMINAL | VOLTAGE |
|---|---|---|---|
| ITEM NAME | VOLTAGE 1 | VOLTAGE 5 | GAIN 1 |
| ITEM NO. & SYMBOL | 1, V1 | 2, V5 | 3, GV1 |
| PERIPHERAL CIRCUIT |  |  |  |
| SWITCH GROUP 1 | 1, 3 |  | 2, 4, 6 |
| SWITCH GROUP 2 | 18 |  |  |
| SWITCH GROUP 3 | 38 |  |  |
| SWITCH GROUP 4 |  |  |  |
| HARDWARE SETTING |  |  |  |
| SINGLE MODE MEASUREMENT | VM |  | AVM, A |
| PIN CONNECTION | PRV13 = 4 V, 20 mA |  |  |
|  | P1 = VM | P5 = VM |  |
|  | P2 = S1 |  |  |
|  | P3 = PRV13 |  |  |
|  | P4 = GND |  |  |
|  | S1 = 12 V, 200 mA |  |  |
| SETTING OF VOLT MEASURING DEVICE | DC20 V |  |  |
| SETTING OF TIME MEASURING DEVICE |  |  |  |
| SETTING OF AUDIO SIGNAL GENERATOR |  |  | 1 kHz |
|  |  |  | 10 mVrms |
| SETTING OF AUDIO SIGNAL MEASURING DEVICE |  |  | RMS 2 V AC |
|  |  |  | 100 mS × 1 |
| SOURCE | ON WAIT = 10 mS | ON WAIT = 10 mS | ON WAIT = 3 mS |
| SOURCE SUPPLY TO ELECTRONIC CIRCUIT | ON WAIT = 100 mS | ON WAIT = 100 mS | ON WAIT = 100 mS |
| MEASURED DATA FORMAT | X.XX V |  | X.XX dB |
| SETTING OF EVALUATION CRITERION | 5.35 6.35 | 2.00 3.00 | 37 43 |
| SETTING OF COMPUTATION | 12-MEAS |  | 20 logVM/10 |
| SORTING/DISPLAY OF MEASURE RESULT | FBIN = 5 | FBIN = 6 | FBIN = 7 |
| DISMISSAL OF MEASURING CONDITIONS |  |  |  |
| ITEMS | VOLTAGE | OSCILLATION | OSCILLATION |
| ITEM NAME | GAIN 2 | FREQUENCY 1 | FREQUENCY 2 |
| ITEM NO. & SYMBOL | 4, GV2 | 5, FREQ1 | 6, FREQ2 |
| PERIPHERAL CIRCUIT |  |  |  |
| SWITCH GROUP 1 |  | 2, 4 |  |
| SWITCH GROUP 2 |  |  |  |
| SWITCH GROUP 3 |  |  |  |
| SWITCH GROUP 4 |  | 50, 61 |  |
| HARDWARE SETTING |  |  |  |
| SINGLE MODE MEASUREMENT |  | TIME, C |  |
| PIN CONNECTION |  |  |  |
|  | S1 = 10 V | S1 = 12 V | S1 = 9 V |

TABLE 8-continued

| | | FREQ A | |
|---|---|---|---|
| SETTING OF VOLT MEASURING DEVICE | | | |
| SETTING OF TIME MEASURING DEVICE | | | |
| | | 0 V, +SL100 kHz | 0 V, +SL10 kHz |
| SETTING OF AUDIO SIGNAL GENERATOR | | 10 kHz | 1 kHz |
| | 2 mVrms | 10 mVrms | |
| SETTING OF AUDIO SIGNAL MEASURING DEVICE | | | |
| SOURCE | ON WAIT = 3 mS | ON WAIT = 3 mS | ON WAIT = 3 mS |
| SOURCE SUPPLY TO ELECTRONIC CIRCUIT | ON WAIT = 100 mS | ON WAIT = 100 mS | ON WAIT = 100 mS |
| MEASURED DATA FORMAT | | X.XX kH | |
| SETTING OF EVALUATION CRITERION | . | 9.10 10.90 | |
| SETTING OF COMPUTATION | 20 logVM/2 | | |
| SORTING/DISPLAY OF MEASURE RESULT | FBIN = 8 | FBIN = 9 | FBIN = 10 |
| DISMISSAL OF MEASURING CONDITIONS | | | ALL CLEAR |

The measurement execution program thus obtained may have a plurality of measuring items which can be measured in parallel. The measurement execution program is then modified by combining the measuring programs of such measuring items. The measurement execution program is further modified as desired through debugging. When this modification is conducted, corresponding amendment is conducted on the measurement specification description program. Actual measurement of characteristics of an electronic circuit is then conducted in accordance with this measurement execution program.

When a change in the measuring sequence is necessary, a revised measurement execution program is formed on the basis of the measurement specification description program which has been amended in accordance with the result of the debugging. If the revised measurement execution program has to be formed on the basis of the measurement execution program which was actually used in the measurement, quite a complicated operation is necessary because the measurement execution program has been simplified as shown in Table 8 and because reforming by combination of a plurality of measuring item programs for parallel measurement has been conducted on the measurement execution program. In contrast, according to the invention, the revision of the measurement execution program is conducted without difficulty because the measurement specification description program on which the revision is based directly corresponds to the measurement specification description table shown in Table 7.

In consequence, the present invention enables a computer or the like system to conduct, without human aid, formation of tables and programs such as the measurement specification description table, measurement specification description program and measurement execution program, as well as revision of the measurement execution program which is conducted as required to meet a demand for a change in the measuring sequence.

What is claimed is:

1. A method of measuring characteristics of an electronic circuit by means of a measuring apparatus which operates in accordance with a measurement execution program, said method comprising:

expressing a plurality of measurement specifications corresponding to a plurality of measurement items in the form of a measurement specification description table of a fixed-word-length type;

forming a measurement specification description program in which said measurement specification description table is directly reflected;

forming a measurement execution program by appointing a measuring sequence in said measurement specification description program and by removing redundancy and combining programs of a plurality of measuring items which can be measured in parallel;

debugging said measurement execution program by operating said measuring apparatus in accordance with said measurement execution program;

amending said measurement specification description program in accordance with the modification of said measurement execution program affected through the debugging; and measuring the characteristics of said electronic circuit by said measuring apparatus in accordance with said measurement execution program after said debugging.

2. A method according to claim 1, further comprising the steps of:

forming, when a demand exists for a change in the measuring sequence, a revised measurement execution program on the basis of the amended measurement specification description program;

debugging said revised measurement execution program by operating said measuring apparatus in accordance with said revised measurement execution program;

amending again said measurement specification description program in accordance with the modification of said revised measurement execution program affected through said debugging; and measuring the characteristics of said electronic circuit by operating said measuring apparatus in accordance with said revised measurement execution program after the debugging.

3. A method according to claim 1, wherein said measurement specification description program describes the measurements of said plurality of measurement items in independent and completive forms.

4. A method according to claim 1, wherein said redundancy includes duplicate portion of said program and portion of said program which is considered to be useless judging from the measuring sequence.

* * * * *